United States Patent [19]

Lines

[11] Patent Number: 5,822,253
[45] Date of Patent: *Oct. 13, 1998

[54] DYNAMIC MEMORY WORD LINE DRIVER SCHEME

[75] Inventor: Valerie L. Lines, Ottawa, Canada

[73] Assignee: MOSAID Technologies Incorporated, Ontario, Canada

[*] Notice: This patent issued on a continued prosecution application filed under 37 CFR 1.53(d), and is subject to the twenty year patent term provisions of 35 U.S.C. 154(a)(2).

[21] Appl. No.: 515,904

[22] Filed: Aug. 16, 1995

Related U.S. Application Data

[63] Continuation of Ser. No. 205,776, Mar. 3, 1994, abandoned, which is a continuation of Ser. No. 31,898, Mar. 16, 1993, abandoned, which is a continuation of Ser. No. 680,746, Apr. 5, 1991, Pat. No. 5,214,602.

[30] Foreign Application Priority Data

Apr. 6, 1990 [GB] United Kingdom ............... 9007790
Apr. 5, 1991 [JP] Japan ............................. 910165.4

[51] Int. Cl.$^6$ ..................................................... G11C 8/00
[52] U.S. Cl. ................ 365/189.11; 365/226; 365/230.06
[58] Field of Search ............................. 365/189.11, 226, 365/230.06

[56] References Cited

U.S. PATENT DOCUMENTS

| 4,189,782 | 2/1980 | Dingwall | 365/190 |
| 4,730,132 | 3/1988 | Watanabe et al. | 307/446 |
| 4,814,647 | 3/1989 | Tran | 365/226 |
| 5,031,149 | 7/1991 | Matsumoto et al. | 365/189.11 |
| 5,038,327 | 8/1991 | Akaogi | 365/230.06 |
| 5,150,325 | 9/1992 | Yanagisawa et al. | 365/177 |

OTHER PUBLICATIONS

Kitsukawa, Goro et al., "A 1–Mbit BiCMOS DRAM Using Temperature–Compensation Circuit Techniques," IEEE Journal of Solid–State Circuits, vol. 24, No. 3, Jun. 1989, pp. 597–601.

Kitsukawa, Goro et al., "A 23–ns 1–Mb BiCMOS DRAM," IEEE Journal of Solid–State Circuits, vol. 25, No. 5, Oct. 1990, pp. 1102–1111.

Nakagome, Yoshinobu et al, "An Experimental 1.5–V 64–Mb DRAM," IEEE Journal of Solid–State Circuits, vol. 26, No. 4, Apr. 1991, pp. 465–472.

Fujii, Syuso et al., "A 45–ns 16–Mbit DRAM with Triple–Well Structure," IEEE Journal of Solid–State Circuits, vol. 24, No. 5, Oct. 1989, pp. 1170–1174.

Gillingham, Peter et al., "High–Speed, High–Reliability Circuit Design for Megabit DRAM," IEEE Journal of Solid–State Circuits, vol. 26, No. 8, Aug. 1991, pp. 1171–1175.

*Primary Examiner*—A. Zarabian
*Attorney, Agent, or Firm*—Hamilton, Brook, Smith & Reynolds, P.C.

[57] ABSTRACT

A circuit which accurately controls the word line (pass transistor gate) driving voltage to a voltage which is both controlled and is not significantly greater than is needed to drive the word line. The elements of the present invention eliminate the need for a double-boot-strapping circuit, and ensure that no voltages exceed that necessary to fully turn on a memory cell access transistor. Accordingly, voltages in excess of that which would reduce reliability are avoided, and accurate driving voltages are obtained. A DRAM is comprised of bit lines and word lines, memory cells connected to the bit lines and word lines, each memory cell being comprised of an access field effect transistor (FET) having its source-drain circuit connected between a bit line and a high logic level voltage $V_{dd}$ bit charge storage capacitor, the field effect transistor having a gate connected to a corresponding word line; a high $V_{pp}$ supply voltage source which is in excess of high logic level voltage $V_{dd}$ plus one transistor threshold voltage but less than a transistor damaging voltage; means for selecting the word line and means having an input driven by the selecting means for applying the $V_{pp}$ supply voltage level directly to the word line through the source-drain circuit of an FET. Thus an above $V_{dd}$ voltage level on the word line is achieved without the use of double boot-strap circuits.

36 Claims, 1 Drawing Sheet

DYNAMIC MEMORY WORD LINE DRIVER SCHEME

This is a continuation of application Ser. No. 08/205,776 filed Mar. 3, 1994, abandoned Oct. 4, 1995, which is a continuation of application Ser. No. 08/031,898 filed Mar. 16, 1993 (abandoned), Mar. 16, 1993, which is a continuation of application Ser. No. 07/680,746 filed Apr. 5, 1991 (now U.S. Pat. No. 5,214,602).

FIELD OF THE INVENTION

This invention relates to CMOS dynamic random access memories (DRAMs), and particularly to word line drivers.

BACKGROUND TO THE INVENTION

Dynamic random access memories are generally formed of a matrix of bit lines and word lines with memory cells located adjacent the intersections of the bit lines and word lines. The memory cells are enabled to provide their stored bits to the bit lines or to permit a write operation by signals carried on the word lines.

Each memory cell is typically formed of a bit storage capacitor connected to a reference voltage and through the source-drain circuit of an "access" field effect transistor to an associated bit line. The gate of the field effect transistor is connected to the word line. A logic signal carried by the word line enables the transistor, thus allowing charge to flow through the source-drain circuit of the transistor to the capacitor, or allowing charge stored on the capacitor to pass through the source-drain circuit of the access transistor to the bit line.

In order for the logic level $V_{dd}$ potential from the bit line to be stored on the capacitor, the word line must be driven to a voltage above $V_{dd}+V_{tn}$, where $V_{tn}$ is the threshold voltage of the access transistor including the effects of back bias.

During the early days of DRAM design, NMOS type FETs, that is, N-channel devices were used exclusively. In order to pass a $V_{dd}+V_{tn}$ level signal to the selected word line, the gate of the pass transistor had to be driven to at least $V_{dd}+2V_{tn}$. Furthermore, to allow sufficient drive to achieve a voltage greater than $V_{dd}+V_{tn}$ on the word line within a reasonable length of time in order to facilitate a relatively fast memory, the gate of the pass transistor is driven to a significantly higher voltage. In such devices, the word line driving signal utilized capacitors in a well-known double-boot strap circuit.

In the above circuit, the boot strapping voltage circuit is designed to exceed the voltage $V_{dd}+2V_{tn}$, in order to ensure that temperature, power supply, and process variations would never allow the pass transistor driving voltage to fall below $V_{dd}+2V_{tn}$.

However, it has been found that in small geometry VLSI memories, the high voltages provided by the boot-strap circuits can exceed the tolerable voltages in the memory, thus adversely affecting reliability.

SUMMARY OF THE INVENTION

The present invention is a circuit which accurately controls the word line (pass transistor gate) driving voltage to a voltage which is both controlled and is not significantly greater than is needed to drive the word line. The elements of the present invention eliminate the need for a double-boot-strapping circuit, and ensure that no voltages exceed that necessary to fully turn on a memory cell access transistor. Accordingly, voltages in excess of that which would reduce reliability are avoided, and accurate driving voltages are obtained.

According to an embodiment of the invention, a dynamic random access memory (DRAM) is comprised of bit lines and word lines, memory cells connected to the bit lines and word lines, each memory cell being comprised of an access field effect transistor (FET) having its source-drain circuit connected between a bit line and a bit charge storage capacitor, the access field effect transistor having a gate connected to a corresponding word line; a high supply voltage source $V_{pp}$; a circuit for selecting the word line and a circuit having an input driven by the selecting apparatus for applying the $V_{pp}$ supply voltage directly to the word line.

BRIEF INTRODUCTION TO THE DRAWINGS

A better understanding of the invention will be obtained by reference to the detailed description below, in conjunction with the following drawings, in which:

FIG. 1 is a schematic diagram of the invention.

DESCRIPTION OF A PREFERRED EMBODIMENT OF THE INVENTION

Figure 1:
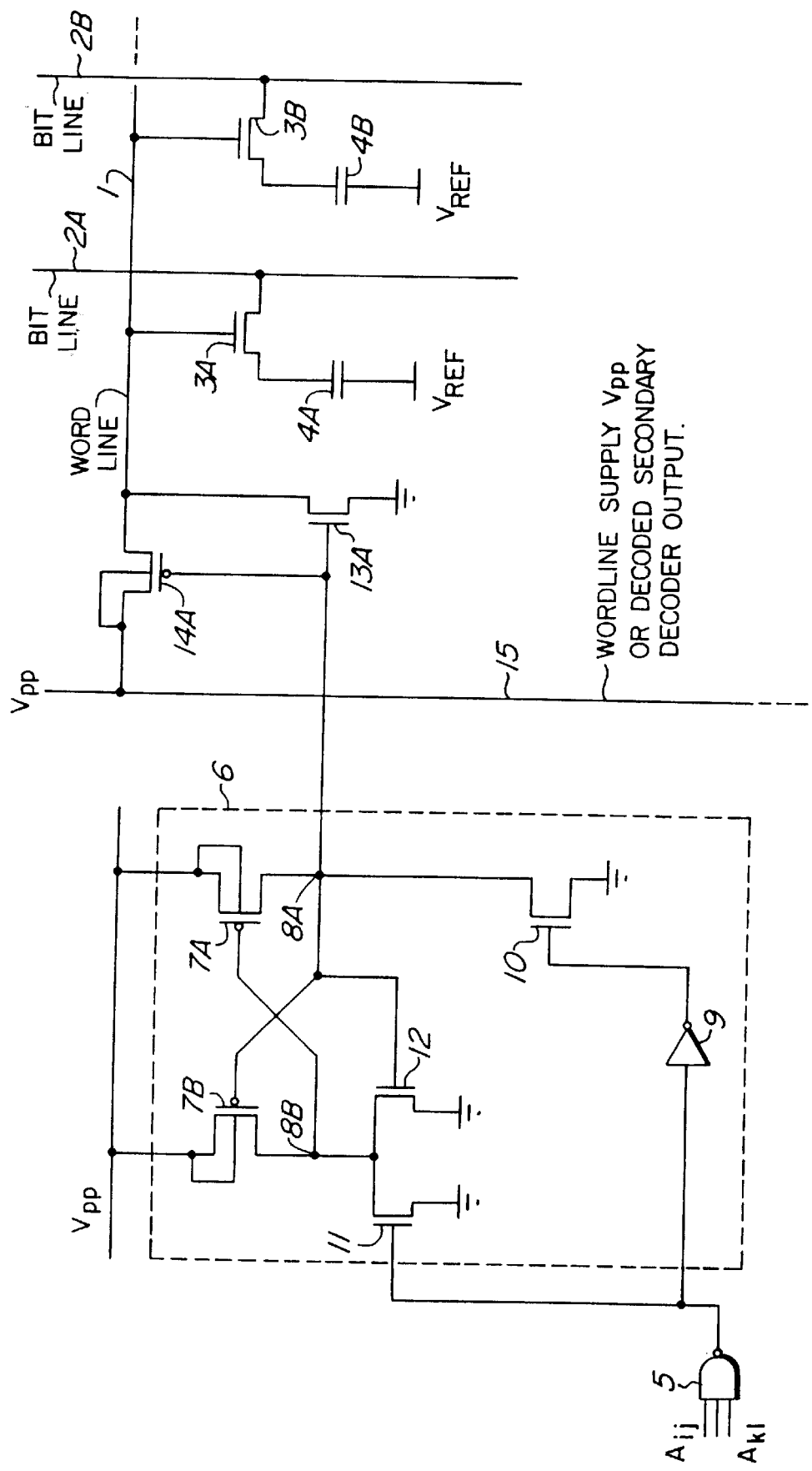

Turning now to FIG. 1, a CMOS DRAM is comprised of word lines, represented by word line 1 and bit lines, represented by bit lines 2A, 2B, etc. Access transistors 3A, 3B have their gates connected to the word line; their sources are connected to bit charge storing capacitors 4A, 4B, etc. which are also connected to ground. The drains of access transistors 3A, 3B, etc. are connected to the bit lines 2A, 2B, etc.

With the application of a logic signal of $V_{dd}+V_{tn}$ to the gate of transistor 3A, 3B, etc., $V_{dd}$ level on the bit line 2A, 2B, etc. is fully transferred to the associated capacitor 4A, 4B, etc. during the writing cycle. In the prior art it was necessary to apply a voltage greater than $V_{dd}+2V_{tn}$ to the gate of an N-channel pass transistor in order to ensure that a voltage in excess of $V_{dd}+V_{tn}$ would be available at the gates of transistors 3A, 3B, etc.

The combination of a bit storing charge capacitor, e.g. 4A, with an associated access transistor, e.g. 3A, forms a memory cell in prior art DRAMs.

The word line is selected by means of addresses $A_{ij}$ applied to the inputs of a NAND gate 5. In the prior art a double boot-strap circuit was connected between the output of NAND gate 5 and the word line.

In accordance with the present invention a voltage $V_{pp}$ which is higher than the logic level $V_{dd}+V_{tn}$ is utilized. A level shifter 6 is formed of a pair of cross coupled P-channel transistors 7A and 7B. The sources of transistors 7A and 7B are connected to the voltage source $V_{pp}$. The level shifter defines a first and a second control node, respectively 8A and 8B.

The output of NAND gate 5 is connected through an inverter 9 to the gate of an N-channel FET 10. FET 10 has its source connected to ground and its drain connected to control node 8A.

The output of NAND gate 5 is connected to the gate of an N-channel FET 11, which has its source connected to ground and its drain connected to control node 8B. A third N-channel FET 12 has its source connected to ground, its drain connected to the drain of transistor 11, and its gate to control node 8A.

Control node 8A (or a buffered version of control node 8A) is applied to the gate of pass transistor 14A and pull down transistor 13A. The source of pass transistor 14A is connected to $V_{pp}$ or to a secondary decoder output which provides a $V_{ss}$ or $V_{pp}$ level output; its drain to word line 1. The source of pull down transistor 13A is connected to ground; the drain is connected to word line 1.

In operation, assume that the word line 1 has not been selected. At least one address input of NAND gate 5 is low, causing the output of NAND gate 5 to be high, and the output of inverter 9 to be low. Transistor 11 is enabled, pulling node 8B to ground. Transistor 10 is disabled, allowing transistor 7A to charge node 8A to $V_{pp}$. Transistor 12 is thus enabled ensuring that node 8A is pulled high. The $V_{pp}$ level node 8A disables the pass device 14A and enables pull down transistor 13A so that word line 1 is held at ground. Thus transistors 3A and 3B are not enabled and are not conducting. The charge stored on capacitors 4A and 4B are thus maintained, and are not read to the bit lines.

Assume now that word line 1 is selected. Logic high level address signals at the voltage level $V_{dd}$ are applied to the inputs of NAND gate 5. The output of the NAND gate thus goes to low level. The output of inverter 9 changes to high level, transistor 10 is enabled, and pulls node 8A toward ground. This causes transistor 7B to be enabled, and pull node 8B toward $V_{pp}$. This causes transistor 7A to be disabled so that node 8A is pulled to ground, disabling transistor 12 and allowing transistor 7B to charge node 8B to $V_{pp}$. The ground level voltage on node 8A disables pull down transistor 13A, and enables the pass transistor 14A so that the word line 1 is driven to a $V_{pp}$ level. The voltage on the word line is thus controlled, and depending on whether the word line is selected or not, it switches between ground and $V_{pp}$. With the voltage $V_{pp}$ being controlled to $V_{dd}+V_{tn}$, the voltage at the gates of the cell access transistors 3A and 3B is certain to be $V_{dd}+V_{tn}$. However the voltage $V_{pp}$ is selected to be less than a voltage that would deteriorate reliability of the DRAM.

A person understanding this invention may now conceive of alternative structures and embodiments or variations of the above. All of those which fall within the scope of the claims appended hereto are considered to be part of the present invention.

I claim:

1. A dynamic random access memory (DRAM) comprising:
   (a) word lines,
   (b) memory cells, each comprising a charge storage capacitor and a series pass transistor for storing a $V_{dd}$ logic level on the storage capacitor, the series pass transistor having an enable input connected to a word line,
   (c) means for receiving word line decoding signals for providing a select signal at $V_{dd}$ logic levels, the $V_{dd}$ logic levels having a $V_{dd}$ voltage difference between logic levels,
   (d) a high voltage power supply $V_{xx}$ which supplies a voltage for a $V_{xx}$ voltage difference between logic levels which exceeds $V_{dd}$,
   (e) translating means connected to said receiving means and supply $V_{xx}$ for translating said select signals at said $V_{dd}$ logic levels to said $V_{xx}$ logic levels and for applying $V_{xx}$ logic levels to said word lines for application to said enable inputs, the translating means being set and reset only by $V_{dd}$ logic level signals and being devoid of voltage boost capacitor.

2. A CMOS dynamic random access memory (DRAM) comprising:
   (a) word lines,
   (b) memory cells having enable inputs connected to said word lines,
   (c) a word line driver circuit for each word line, each word line driver comprising:
      (i) a gate for receiving word line address signals and for providing a first select output signal at $V_{dd}$ logic levels,
      (ii) an inverter having an input connected to receive said select output signal, and for providing a second select output signal at $V_{dd}$ logic levels,
      (iii) a pair of N-channel field effect transistors (FETs), one having its gate connected to the output of the inverter and the other connected to receive said first select output signal, said transistors having their sources connected to ground ($V_{ss}$),
      (iv) a level shifter comprised of a pair of cross-coupled P-channel field effect transistors, the drain of each being connected to the gate of the other, the sources of said P-channel transistors being connected to a voltage supply $V_{pp}$ which is higher than said logic level $V_{dd}$, the drain of one P-channel transistor being connected to the drain of said one N-channel transistor, the drain of said other P-channel transistor being connected to the drain of said other N-channel transistor,
      (v) a P-channel word line driver pass transistor having its source connected to $V_{pp}$ or to a secondary decoder output supplying $V_{pp}$ logic levels, its drain connected to a word line and its gate connected to the drain of one of said P-channel cross coupled transistors,
      (vi) an N-channel word line pulldown transistor having its source connected to $V_{ss}$, its drain connected to said word line, and its gate connected to the drain of said one of said P-channel cross coupled transistors,
   (d) each memory cell being comprised of an N-channel access transistor and a bit storage capacitor, the access transistor having its gate connected to an associated word line, a source connected to the bit charge storage capacitor, and a drain connected to a bit line, the other plate of the bit storage capacitor being connected to a cell plate reference voltage.

3. A dynamic random access memory as defined in claim 1 in which $V_{xx}$ is a controlled voltage.

4. A dynamic random access memory as defined in claim 1 wherein said translating means comprises a level shifter comprised of a pair of cross-coupled field effect transistors, each of the cross-coupled field effect transistors being connected between the supply $V_{xx}$ and a respective field effect transistor gated by a $V_{dd}$ level signal.

5. A circuit for controlling the driving voltage to be applied to a control electrode of a pass transistor in a semiconductor memory to charge a storage capacitor comprising a controlled high voltage $V_{pp}$ supply which is in excess of a high logic level voltage $V_{dd}$ plus one field effect transistor threshold voltage but is less than a transistor damaging voltage, means for applying the high voltage $V_{pp}$ to the control electrode of the pass transistor through another field effect transistor, and means for enabling said another transistor to pass said high voltage $V_{pp}$ to said control electrode, said means for enabling being set and reset only by $V_{dd}$ level signals and being devoid of voltage boost capacitor.

6. A circuit as defined in claim 5 in which $V_{pp}$ is a controlled stable voltage.

7. A circuit as defined in claim 5 wherein said means for enabling comprises a level shifter comprised of a pair of cross-coupled p-channel field effect transistors, each of the cross-coupled p-channel transistors being connected between the high voltage $V_{pp}$ supply and a respective n-channel transistor which is gated by $V_{dd}$ level signals.

8. A circuit for controlling the driving voltage to be applied to a control electrode of a pass transistor to charge a storage capacitor to a voltage level $V_{dd}$ in a semiconductor memory comprising a controlled high voltage $V_{xx}$ supply which supplies a voltage for a $V_{xx}$ voltage difference between logic levels which exceeds $V_{dd}$ by one field effect transistor threshold voltage, the voltage difference being less than a transistor damaging voltage, means for applying the high voltage $V_{xx}$ to the control electrode of the pass transistor through another field effect transistor, and means for enabling said another transistor to pass said high voltage $V_{xx}$ to said control electrode, said means for enabling being set and reset only by $V_{dd}$ level signals and being devoid of voltage boost capacitor.

9. A random access memory comprising:

(a) word lines, (b) memory cells, each comprising a charge storage capacitor and a series pass transistor for storing a $V_{dd}$ logic level on the storage capacitor, the series pass transistor having an enable input connected to a word line, (c) means for receiving word line decoding signals for providing a select signal at $V_{dd}$ voltage levels, the $V_{dd}$ logic levels having a $V_{dd}$ voltage difference between logic levels, (d) a power supply $V_{xx}$ which supplies a voltage for a $V_{xx}$ voltage difference between logic levels which exceeds $V_{dd}$, and (e) translating means connected to said receiving means and supply $V_{xx}$ for translating said select signals to said $V_{xx}$ logic levels and for applying $V_{xx}$ logic levels directly to said word lines for application to said enable inputs, the translating means being set and reset only by $V_{dd}$ logic level signals and being devoid of voltage boost capacitor.

10. A random access memory as defined in claim 9 in which $V_{xx}$ is a controlled voltage.

11. A random access memory as defined in claim 9 wherein said translating means comprises a level shifter comprised of a pair of cross-coupled field effect transistors, each of the cross-coupled field effect transistors being connected between the supply $V_{xx}$ and a respective field effect transistor gated by a $V_{dd}$ level signal.

12. A semiconductor memory circuit for controlling the driving voltage to be applied to a control electrode of a pass transistor, for charging a storage capacitor to a $V_{dd}$ level in a memory cell, comprising a controlled high voltage $V_{pp}$ supply which is in excess of a high logic level voltage $V_{dd}$ plus one field effect transistor threshold voltage but is less than a transistor damaging voltage, means for applying the high voltage $V_{pp}$ to the control electrode of the pass transistor through another transistor, and means for enabling said another transistor to pass said voltage $V_{pp}$ to said control electrode, said means for enabling being set and reset only by $V_{dd}$ level signals and being devoid of voltage boost capacitor.

13. A circuit as defined in claim 12 wherein said means for enabling comprises a level shifter comprised of a pair of cross-coupled p-channel field effect transistors, each of the cross-coupled p-channel transistors being connected between the high voltage $V_{pp}$ supply and a respective n-channel transistor which is gated by $V_{dd}$ level signals.

14. A memory circuit for controlling the driving voltage to be applied to a control electrode of a pass transistor, for charging a storage capacitor to a $V_{dd}$ level in a memory cell, comprising a controlled voltage $V_{xx}$ supply which supplies a voltage for a $V_{xx}$ voltage difference between logic levels which exceeds $V_{dd}$ by one field effect transistor threshold voltage, the voltage difference $V_{xx}$ being less than a transistor damaging voltage, means for applying the voltage $V_{xx}$ to the control electrode of the pass transistor through another transistor, and means for enabling said another transistor to pass said voltage $V_{xx}$ to said control electrode, said means for enabling being set and reset only by $V_{dd}$ level signals and being devoid of voltage boost capacitor.

15. A dynamic random access memory comprising:

word lines;

dynamic memory cells, each comprising a charge storage capacitor for storing a $V_{dd}$ logic level through an access transistor, the access transistors having enable inputs connected to the word lines;

a high voltage supply which supplies a controlled high voltage $V_{pp}$ greater than $V_{dd}$; and a word line driver circuit which applies the controlled high voltage $V_{pp}$ from the high voltage supply to a word line, including a latching level shifter which receives word line selection signals at $V_{dd}$ logic levels to drive and latch first and second word line control signals at $V_{pp}$ logic levels, each control signal in a respective latch state being pulled down to a low level as the other control signal is latched high, the control signals being both set and reset by respective transistors gated by $V_{dd}$ level signals.

16. The dynamic random access memory of claim 15 wherein one control signal is pulled down through an MOS transistor of one polarity type as the other control signal is latched high through an MOS transistor of the opposite polarity type.

17. The dynamic random access memory of claim 16 wherein the one polarity type is N-channel and the opposite polarity type is P-channel.

18. The dynamic random access memory of claim 15 wherein the transistors gated by $V_{dd}$ level signals are pull-down transistors.

19. A random access memory as claimed in claim 15 wherein a p-channel field effect transistor connected between the voltage supply and the word line driven is by one of the control signals.

20. A random access memory as claimed in claim 19 further comprising an n-channel field effect transistor connected between the word line and ground.

21. A random access memory as claimed in claim 20 wherein the word line driver circuit is a CMOS circuit.

22. A dynamic random access memory comprising:

word lines;

dynamic memory cells, each comprising a charge storage capacitor for storing a $V_{dd}$ logic level through an access transistor, the access transistors having enable inputs connected to the word lines;

a voltage supply which supplies a controlled voltage as one of two word line driving voltage levels having a voltage difference which exceeds a $V_{dd}$ voltage difference between $V_{dd}$ logic levels; and a word line driver circuit which applies the controlled voltage from the voltage supply to a word line, including a latching level shifter which receives word line selection signals at $V_{dd}$ logic levels to drive and to latch first and second word line control signals at the word line driving voltage levels, each control signal in a respective latch state being pulled to one level as the other is latched to a second level, the control signals being both set and reset by respective transistors gated by $V_{dd}$ level signals.

23. The dynamic random access memory of claim 22 wherein one control signal is pulled down through an MOS transistor of one polarity type as the other control signal is latched high through an MOS transistor of the opposite polarity type.

24. The dynamic random access memory of claim 23 wherein the one polarity type is N-channel and the opposite polarity type is P-channel.

25. The dynamic random access memory of claim 22 wherein the transistors gated by $V_{dd}$ level signals are pull-down transistors.

26. A random access memory as claimed in claim 22 wherein a p-channel field effect transistor connected between the voltage supply and the word line is driven by one of the control signals.

27. A random access memory as claimed in claim 26 further comprising an n-channel field effect transistor connected between the word line and ground.

28. A random access memory as claimed in claim 27 wherein the word line driver circuit is a CMOS circuit.

29. A dynamic random access memory having word lines, dynamic memory cells each comprising a charge storage capacitor for storing a $V_{dd}$ logic level through an access transistor, the access transistors having enable inputs connected to the word lines, and a controlled high voltage $V_{pp}$ supply for providing a $V_{pp}$ supply voltage in excess of $V_{dd}+V_{TN}$, the dynamic random access memory further comprising:

a word line driver circuit, which applies the controlled high voltage $V_{pp}$ from the $V_{pp}$ supply to a selected word line, including a latching level shifter which has the $V_{pp}$ supply voltage applied thereto and which, upon receiving word line select signals at $V_{dd}$ logic levels, drives and latches first and second word line control signals at $V_{pp}$ logic levels, the word line driver circuit comprising cross-coupled field effect transistors to latch the control signals, each control signal in a respective latch state being pulled down to a low voltage as the other control signal is latched high to the high $V_{pp}$ voltage, the control signals being set and reset by respective pull-down transistors gated by only the $V_{dd}$ logic level select signals, one of the control signals being applied to the gate of a field effect transistor which is coupled source-to-drain between the high voltage $V_{pp}$ supply and the word line.

30. A dynamic random access memory as claimed in claim 29 wherein the controlled high voltage $V_{pp}$ is applied from a secondary decoder.

31. A method of selecting a word line in a dynamic random access memory to store signals of first logic levels comprising:

decoding address signals of the first logic levels to drive first and second level shifted control signals to second logic levels, including a voltage level provided by a controlled high voltage supply which is greater than a voltage to be stored in a memory cell, and latching the level shifted control signals, each control signal in a respective latch state being pulled down to a low level as the other control signal is latched high, the control signals being both set and reset by respective transistors gated by signals of the first logic levels; and from one of the latched, level shifted control signals applying a controlled high voltage, from the controlled high voltage supply, to a selected word line.

32. A method as claimed in claim 31 wherein one control signal is pulled down through an MOS transistor of one polarity type as the other control signal is latched high through an MOS transistor of the opposite polarity type.

33. A method as claimed in claim 32 wherein the one polarity type is N-channel and the opposite polarity type is P-channel.

34. A method as claimed in claim 31 wherein the transistors which set and rest the control signals are pull-down transistors.

35. A method as claimed in claim 31 wherein one of the control signals drives a p-channel field effect transistor connected between the voltage supply and the word line.

36. A method as claimed in claim 35 wherein the word line is reset by an n-channel field effect transistor connected between the word line and ground.

* * * * *

UNITED STATES PATENT AND TRADEMARK OFFICE
CERTIFICATE OF CORRECTION

PATENT NO.   : 5,822,253
DATED        : October 13, 1998
INVENTOR(S)  : Valerie L. Lines It is certified that error appears in the above-identified patent and that said Letters Patent is hereby corrected as shown below:

<u>Column 6,</u>
Line 45, change "the word line driven is by" to -- the word line is driven by --.

Signed and Sealed this

Eleventh Day of March, 2003

JAMES E. ROGAN
*Director of the United States Patent and Trademark Office*

Disclaimer 5,822,253 — Valerie L. Lines, Ottawa, Canada. DYNAMIC MEMORY WORD LINE DRIVER SCHEME. Patent dated Oct. 13, 1998. Disclaimer filed Oct. 4, 2002, by the assignee, MOSAID Technologies Incorporated.

The term of this patent shall not extend beyond the expiration date of Pat. Nos. 5,214,602 and 5,751,643.
*(Official Gazette, April 29, 2003*